United States Patent
Kübelbeck et al.

(10) Patent No.: US 8,540,891 B2
(45) Date of Patent: Sep. 24, 2013

(54) ETCHING PASTES FOR SILICON SURFACES AND LAYERS

(75) Inventors: Armin Kübelbeck, Bensheim (DE); Sylke Klein, Rossdorf (DE); Werner Stockum, Reinheim (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 10/526,497

(22) PCT Filed: Aug. 8, 2003

(86) PCT No.: PCT/EP03/08805
§ 371 (c)(1),
(2), (4) Date: Mar. 4, 2005

(87) PCT Pub. No.: WO2004/032218
PCT Pub. Date: Apr. 15, 2004

(65) Prior Publication Data
US 2005/0247674 A1 Nov. 10, 2005

(30) Foreign Application Priority Data
Sep. 4, 2002 (DE) .................................. 102 41 300

(51) Int. Cl.
*C03C 15/00* (2006.01)
*C25F 3/00* (2006.01)

(52) U.S. Cl.
USPC ............................................. 216/92; 216/99

(58) Field of Classification Search
USPC .................................................. 216/92, 99
See application file for complete search history.

(56) References Cited

U.S. PATENT DOCUMENTS

| | | | |
|---|---|---|---|
| 4,448,637 A | 5/1984 | Hiraishi et al. | |
| 4,686,065 A | 8/1987 | Bliznik et al. | |
| 5,258,777 A * | 11/1993 | DeJager et al. | 347/258 |
| 5,688,366 A | 11/1997 | Ichinose et al. | |
| 5,704,992 A * | 1/1998 | Willeke et al. | 136/255 |
| 6,133,119 A * | 10/2000 | Yamazaki | 438/476 |
| 6,338,743 B1 | 1/2002 | Dusemund et al. | |
| 6,391,145 B1 * | 5/2002 | Nishimoto et al. | 156/345.12 |
| 6,426,288 B1 * | 7/2002 | Meikle | 438/650 |
| 6,451,218 B1 | 9/2002 | Holdermann | |
| 6,641,948 B1 * | 11/2003 | Ohlsen et al. | 429/44 |
| 2001/0029156 A1 * | 10/2001 | Miyashita et al. | 451/56 |
| 2002/0079290 A1 * | 6/2002 | Holdermann | 216/99 |
| 2002/0162218 A1 * | 11/2002 | Skorupski et al. | 29/847 |
| 2003/0160026 A1 | 8/2003 | Klein et al. | |
| 2004/0063326 A1 * | 4/2004 | Szlufcik et al. | 438/695 |

FOREIGN PATENT DOCUMENTS

| | | |
|---|---|---|
| DE | 10014445 | 10/2001 |
| DE | 10101926 A1 * | 10/2001 |
| EP | 0246536 | 11/1987 |
| EP | 0944114 | 9/1999 |
| JP | 02-042766 A | 2/1990 |
| JP | 08-017789 | 9/2010 |
| JP | 2745229 | 9/2010 |
| WO | WO 0183391 | 11/2001 |

OTHER PUBLICATIONS

English translation of DE10101926 from esp@cenet worldwide database.*

* cited by examiner

*Primary Examiner* — Nathan Empie
(74) *Attorney, Agent, or Firm* — Millen, White, Zelano, Branigan, P.C.

(57) ABSTRACT

The invention relates to novel etching media in the form of etching pastes for etching selected areas or the entire area of silicon surfaces and layers, in addition to the use of said media.

16 Claims, No Drawings

ETCHING PASTES FOR SILICON SURFACES AND LAYERS

The present invention relates to novel etching media in the form of etching pastes for full-area and selective etching of silicon surfaces and layers, and to the use thereof.

PRIOR ART

In the photovoltaics, electronics and semiconductor industry, silicon surfaces and layers are often etched by wet-chemical methods in dip baths. This full-area etching can be carried out either in an acidic medium (isotropic etching) or in an alkaline medium (anisotropic etching). In acidic etching, mixtures of hydrofluoric acid and nitric acid are frequently used, in alkaline etching, strong bases, such as sodium hydroxide solution, potassium hydroxide solution, tetramethylammonium hydroxide (TMAH), etc., are frequently used.

In order to produce defined, fine etching patterns/structures (for example for buried structures) in addition to full-area etching (for example polish etches, texture etches), material-intensive, time-consuming and expensive process steps, such as, for example, the photolithographic masking process known to the person skilled in the art, are necessary before the actual etching step.

In a masking process of this type, the starting material is a silicon wafer. A dense oxide layer is produced thereon by thermal oxidation and structured as follows.

The oxide is uncovered at the desired points by coating with a photoresist, drying, exposing to UV light using a photomask, and subsequently developing, and then removed using hydrofluoric acid. The photoresist which still remains is subsequently removed ("stripped"), for example using a solvent. The Si wafer thus provided with an oxide mask can then be etched selectively at the points not covered by the oxide in a strong base, such as, for example, 30% KOH. The oxide mask is resistant to the base. After selective etching of the silicon, the oxide mask is usually removed again using hydrofluoric acid.

Lithographic processes of this type are not used in the industrial production of solar cells for cost reasons [1]. However, selective structuring/opening of the silicon surface or layer is necessary by the following procedure.

In the production process for a standard silicon solar cell, the p-n transition necessary for the photoelectric effect is formed on a p-doped wafer by, for example, gas diffusion in a $POCl_3$ oven. In the process, an n-doped silicon layer with a thickness of about 500 nm is formed around the entire wafer and has to be partially opened/cut for the later photovoltaic application.

This opening can be carried out mechanically, by laser cutting or dry-etching methods, such as plasma etching.

The disadvantages of mechanical cutting, for example grinding of the cell edges in the final step of the production process (after metallisation), consist in considerable losses of silicon material (and metal paste), the mechanical stress and the formation of crystal defects in the solar cell.

Plasma etching is carried out with fluorinated hydrocarbons, for example with $CF_4$ or $C_2F_6$ gas, in expensive vacuum equipment. In this process, the cells are stacked in advance and etched at the cell edges in the plasma-etching unit. Considerable handling problems during stacking and high wafer breakage rates occur in the process. These technological problems will intensify even further in the future since the aim is, owing to high material costs, to use ever thinner polycrystalline silicon starting substrates (<200 µm) compared with the substrate thicknesses of 250-330 µm which are usual today.

Owing to the requisite linear (XY) movement of the punctiform laser source, the isolation of the p-n transition by laser is a time-consuming, throughput-limiting process. The investment costs considerable. In addition, local crystal defects are generated.

In expensive processes for the production of a selective emitter, which have currently only been developed and used on a laboratory scale, the lithographic oxide masking already described above is used. The oxide masks the wafer in such a way that the areas on which the contacts will later lie remain free. The masked wafer is subjected to phosphorus diffusion and $n^{++}$-doped in the non-masked areas. After removal of the oxide mask, the entire wafer is $n^+$-doped [2].

This gives a solar cell with a selective emitter, i.e. with highly doped $n^{++}$ areas with a depth of 2-3 µm (areas without oxide mask and later lying under the contacts) with a doping concentrations of about $1*10^{20}$ cm$^{-3}$ and a flat (0.5-1 µm) $n^+$-doped emitter over the entire solar cell with a doping concentration of about $1*10^{19}$ cm$^{-3}$.

The alternative to lithography is the use of screen-printed contact lines as etching mask. Both wet-chemical and plasma-chemical etching is described in the literature. Disadvantages of dipping the screen-printed solar cell into a mixture of $HF/HNO_3$—besides the intended removal of silicon between the contact lines—are attack of the silicon beneath the contact lines and etching damage in the metal contact lines themselves. This causes rapid impairment of the fill factor [3].

Plasma-chemical etching (reactive ion etching, RIE) is carried out using gases, such as, for example, $SF_6$ or $SF_6/O_2$, in expensive vacuum equipment and with considerable technological optimisation effort for the process [4], [5], [6].

Besides the formation of the selective emitter, the silicon surface here is structured (roughened, "textured") on the emitter side in such a way that the antireflection behaviour of the solar cell improves.

The object of the invention is to find a less expensive process with lower material losses for opening the p-n transition in solar cells.

The object of the present invention is therefore also to provide a simple, inexpensive process which can be carried out in the solar-cell industry and by means of which silicon surfaces can be etched selectively for the production of emitters and for improving the antireflection behaviour. At the same time, it is an object of the present invention to provide an inexpensive etchant for carrying out the etching process.

The object is achieved, in particular, by an etching medium for the etching of silicon surfaces and layers in the form of a thickened, alkaline liquid, where the etching process is carried out in the alkaline, solvent-containing liquid.

The present object is therefore achieved by the provision of an inexpensive etching paste which can be applied rapidly and selectively, for example using a screen printer or a dispenser, to the areas to be etched and thus significantly minimises firstly the consumption of etching chemicals and secondly the loss of material on the solar cell.

Besides the described opening of the p-n transition of a solar cell, selective etching of silicon using an etching paste enables the production of a selective (also two-stage) emitter in mass production and an improvement in the antireflection behaviour of the solar cell.

The present invention is thus distinguished from processes in which an alkaline viscous salt solution is applied, for example, to ceramic parts and dried (solvent evaporates), and the actual etching process is carried out in the alkaline melt at 300-400° C. [7].

The present invention is a printable and dispensable etching medium in the form of an etching paste which comprises
a. at least one solvent
b. thickeners and
c. optionally additives, such as antifoams, thixotropic agents, flow-control agents, deaerators and adhesion promoters,
and is effective at temperatures of from 70 to 150° C. and/or can, if desired, be activated by the input of energy.

This etching medium comprises, as etching component, an organic or inorganic base in a concentration of from 2 to 50% by weight, preferably from 5 to 48% by weight, based on the total amount.

The etching component which can be employed is at least one component selected from the group consisting of sodium hydroxide, potassium hydroxide, ammonia, ethanolamine, ethylenediamine, tetraalkylammonium hydroxide or one of the ethylenediamine/pyrocatechol and ethanolamine/gallic acid mixtures.

The present invention thus relates to etching media which comprise a solvent selected from the group consisting of water, isopropanol, diethylene glycol, dipropylene glycol, polyethylene glycols, 1,2-propanediol, 1,4-butanediol, 1,3-butanediol, glycerol, 1,5 pentanediol, 2-ethyl-1-hexanol or mixtures thereof, or selected from the group consisting of acetophenone, methyl-2-hexanone, 2-octanone, 4-hydroxy-4-methyl-2-pentanone, 1-methyl-2-pyrrolidone, ethylene glycol monobutyl ether, ethylene glycol monomethyl ether, triethylene glycol monomethyl ether, diethylene glycol monobutyl ether, dipropylene glycol monomethyl ether, carboxylic acid esters, such as [2,2-butoxy(ethoxy)]ethyl acetate, propylene carbonate as such or in a mixture in an amount of from 10 to 90% by weight, preferably in an amount of from 15 to 85% by weight, based on the total amount of the medium.

Etching media according to the invention furthermore comprise a thickener selected from the group consisting of hydroxyalkylguar, xanthan gum, cellulose and/or ethyl-, hydroxypropyl- or hydroxyethylcellulose, carboxymethylcellulose, sodium carboxymethyl-hydroxyethylcellulose, homopolymers or copolymers-based on functionalised vinyl units of acrylic acid, acrylates and alkyl methacrylates ($C_{10}$-$C_{30}$), individually or in a mixture in an amount of from 0.5 to 25% by weight, preferably from 1 to 10% by weight, based on the total amount of the etching medium.

Besides these components, additives selected from the group consisting of antifoams, thixotropic agents, flow-control agents, deaerators and adhesion promoters may be present in an amount of from 0 to 2% by weight, based on the total amount.

The present invention also relates to a process for the etching of silicon surfaces and layers in which an etching medium according to the invention is applied over the entire area or in accordance with the etch structure mask specifically only to the areas of the surface where etching is desired and is removed again after an exposure time of from 30 s to 5 min.

In accordance with the invention, the etching medium acts at a temperature in the range from 70 to 150° C. If necessary, activation is carried out by the input of energy, preferably by means of IR radiation.

In the process according to the invention, the etching medium is applied to the surface to be etched by a screen, template, pad, stamp, ink-jet or manual printing process or by a dispensing technique. After the exposure time and when the etching is complete, the etching medium is rinsed off using a solvent or solvent mixture.

The etching media according to the invention can be used in photovoltaics, semiconductor technology, high-performance electronics, in particular for the production of photodiodes, circuits, electronic components or for the etching of silicon surfaces and layers for isolation of the p-n transition in solar cells. They can also be used for the etching of silicon surfaces and layers for the production of a selective emitter for solar cells, for the etching of silicon surfaces and layers of solar cells for improving the antireflection behaviour, for the etching of silicon surfaces and layers in a process for the production of semiconductor components and circuits thereof, or for the etching of silicon surfaces and layers in a process for the production of components in high-performance electronics.

OBJECT OF THE INVENTION

The object of the invention is for semiconductor surfaces and layers, in particular silicon surfaces and layers, to be etched over the entire area or structured selectively using etching pastes. A technique with a high degree of automation and high throughput which is suitable for transfer of the etching paste to the area to be etched is printing and dispensing. In particular, screen, template, pad, stamp and ink-jet printing processes and the dispensing process are known to the person skilled in the art. Manual application, for example by means of a brush/application roller, is likewise possible.

Depending on the screen, template, klischee or stamp design or cartridge or metering unit control, it is possible to apply the etching pastes described in accordance with the invention over the entire area or selectively in accordance with the etch structure mask only to the areas where etching is desired. All masking and lithography steps are superfluous in this case.

It is thus possible for structuring processes with complex masking or processes such as laser structuring to be significantly shortened and carried out less expensively or for processes which are susceptible to technological faults, such as plasma etching, to be replaced by printing and dispensing techniques. In addition, the etching process can be significantly reduced with respect to the consumption of etching chemicals since the etching paste is only applied to the areas to be etched.

In particular during isolation of the p-n transition in the production of silicon solar cells, the following advantages can be achieved through the use of etching pastes:
  no need for expensive plasma-etching units
  reduction in the high cell breakage rates which occur
  minimisation of the high loss of material during mechanical separation
  avoidance of surface defects In the production of the selective emitter using etching pastes, it is likewise possible to dispense with oxide masking and expensive plasma etching. In addition, selective application of the etching paste avoids underetching of the contact areas. Since masking is not required, even by screen-printed metal contact lines, etching damage to the contacts is excluded.

It should also be noted that, in contrast to the photolithographic, plasma-chemical and laser processes used hitherto, the production of a selective emitter and the improvement in the antireflection behaviour can be made significantly shorter and simpler with the etching paste according to the invention. The wafers are uniformly $n^{++}$-doped over the entire surface.

The areas between the contacts are etched away by the etching paste, thus $n^+$-doped and improved in their antireflection behaviour. A plurality of process steps are thus saved.

The etching operation is preferably carried out with the input of energy, for example in the form of heat radiation (IR lamp) or by means of a hotplate. When etching is complete, the etching pastes are rinsed off the etched surface using a suitable solvent or solvent mixture.

The etching duration can be between a few seconds and several minutes depending on the application, desired etching depth and/or edge sharpness of the etch structures and the etching temperature set.

The etching pastes have the following composition:
etching components
solvents
thickeners
if desired additives, such as, for example, antifoams, thixotropic agents, flow-control agents, deaerators and adhesion promoters In order to etch semiconductor elements from main group 4 of the Periodic Table, such as silicon, strong caustic lyes are used [7]. The etching action of the etching pastes described in accordance with the invention is therefore based on the use of alkaline, silicon-etching solutions.

Acidic etching pastes based on HF or fluoride—as described for oxides [8], [9]—do not exhibit an etching action on silicon.

The alkaline etching components used in the etching pastes described in accordance with the invention can be aqueous solutions of inorganic lyes, such as sodium hydroxide, potassium hydroxide, ammonia or organic-based, alkaline etching mixtures, such as ethylenediamine/pyrocatechol, ethanolamine/gallic acid, tetraalkylammonium hydroxide or combinations of the two.

The proportion of etching components employed is in a concentration range 2-50% by weight, preferably 5-48% by weight, based on the total weight of the etching paste. Particular preference is given to etching media in which the etching components are present in an amount of 10-45% by weight. Particularly suitable are etching media in which the etching component(s) is (are) present in an amount of 30-40% by weight, based on the total weight of the etching paste, since etching rates which facilitate complete opening of the p-n transition and a high throughput and at the same time show high selectivity have been found for etching media of this type.

The etching components are effective in the etching pastes at 70-150° C. On silicon surfaces and layers, etching depths of less than 1 μm have been achieved at temperatures below 100° C. and etching depths of up to 2-3 μm have been achieved at temperatures above 100° C.

Suitable inorganic and/or organic solvents and/or mixtures thereof may be the following:
water
simple or polyhydric alcohols (for example isopropanol, diethylene glycol, dipropylene glycol, polyethylene glycols, 1,2-propanediol, 1,4-butanediol, 1,3-butanediol, glycerol, 1,5 pentanediol, 2-ethyl-1-hexanol) or mixtures thereof
ketones (for example acetophenone, methyl-2-hexanone, 2-octanone, 4-hydroxy-4-methyl-2-pentanone, 1-methyl-2-pyrrolidone)
ethers (for example ethylene glycol monobutyl ether, ethylene glycol monomethyl ether, triethylene glycol monomethyl ether, diethylene glycol monobutyl ether, dipropylene glycol monomethyl ether)
carboxylic acid esters (for example [2,2-butoxy(ethoxy)] ethyl acetate)
esters of carbonic acid (for example propylene carbonate)

Preference is given to the use of water and solvents from the group consisting of the ethers and ketones.

Water has proven particularly suitable.

The proportion of the solvents is in the range 10-90% by weight, preferably 15-85% by weight, based on the total weight of the etching paste. Particularly suitable compositions have proven to be those in which solvents are present in an amount of 55-75% by weight, based on the total weight of the etching paste.

The viscosity of the etching pastes described in accordance with the invention is set by means of network-forming thickeners which swell in the liquid phase and can be varied depending on the desired area of application.

Possible thickeners are crosslinked and uncrosslinked homopolymers and copolymers based on monomer units such as functionalised vinyl units, for example acrylic acid, acrylates, alkyl methacrylates ($C_{10}$-$C_{30}$) and hydroxyalkylguar, xanthan gum and β-glucosidically linked glucose units, i.e. cellulose and/or cellulose derivatives, such as cellulose ethers, in particular ethyl-, hydroxypropyl- or hydroxyethylcellulose, carboxymethylcellulose and salts of the glycolic acid ether of cellulose, in particular sodium carboxymethylcellulose. The thickeners can be employed individually and/or in combination with other thickeners. Preference is given to the use of salts of carboxymethylcellulose and cross-linked acrylic acid polymers as thickener. The sodium salt of carboxymethylcellulose (Finnfix®) and crosslinked acrylic acid homopolymers (Carbomers®) have proven very particularly suitable for this purpose.

The proportion of thickeners necessary for the specific setting of the viscosity range and for the formation of a printable or dispensable paste is in the range 0.5-25% by weight, preferably 1-10% by weight, based on the total weight of the etching paste. Particularly suitable compositions have proven to be those in which thickeners are present in an amount of 1.5-6% by weight.

Additives having properties which are advantageous for the desired purpose are antifoams, for example TEGO® Foamex N (dimethylpolysiloxane), thixotropic agents, for example BYK® 410 (modified urea), Borchigel® Thixo2, flow-control agents, for example TEGO® Glide ZG 400 (polyether-siloxane copolymer), deaerators, for example TEGO® Airex 986 (polymer with silicone tip), and adhesion promoters, for example Bayowet® FT 929 (fluorosurfactant). These can positively influence the printability and dispensability of the etching paste. The proportion of the additives is in the range 0-2% by weight, based on the total weight of the etching paste.

It has been found through experiments that both the choice of the components employed for the preparation of the etching media and the mixing ratio of the components to one another in the etching media is of considerable importance. Depending on the manner in which the etching media are applied to the area to be etched, the percentage ratio of the components to one another should be set differently, since, inter alia, the viscosity and flowability or the thixotropy being set are considerably influenced by the amounts of solvent and thickener present. The amounts of solvent and thickener present in turn influence the etching behaviour. Depending on the type of use in the process according to the invention, it is therefore possible for the person skilled in the art to select a correspondingly adapted composition of the etching medium.

Areas of Application

Areas of application of the etching pastes according to the invention are in the:

solar-cell industry
semiconductor industry
high-performance electronics

The etching pastes according to the invention can be employed in all areas where full-area and/or structured etching of silicon surfaces or layers is desired. Thus, individual structures can be etched over the full area or selectively to the depth desired in each case in a silicon surface or layer.

Areas of application are, for example:

all etching steps (synonymous with structuring steps), including surface cleaning/roughening of silicon surfaces and layers, which result in the production of optoelectrical components, such as solar cells, photodiodes and the like, in particular isolation of the p-n transition in silicon solar cells and the partial removal of doped layers (selective emitters)

all etching steps on silicon surfaces and layers which result in the production of semiconductor components and circuits all etching steps on silicon surfaces and layers which result in the production of components in high-performance electronics (IGBTs, power thyristors, GTOs, etc.).

For better understanding and for illustration of the invention, examples are given below which fall within the scope of protection of the present invention, but are not suitable for restricting the invention to these examples.

EXAMPLES

Example 1

40.0 g of KOH
59.0 g of deionised water
1.5 g of ethylene glycol monobutyl ether
4.0 g of Carbomer (acrylic acid homopolymer)

The chemicals were weighed into a beaker, mixed and dissolved, and the thickener was added with stirring.

The mixture is transferred into containers after a short standing time. This mixture gives an etching paste with which, for example, silicon surfaces and layers can be etched specifically over the entire area or in structures down to a desired depth with and/or without input of energy.

The etching paste was applied to the silicon surface, for example by screen printing or using a dispenser (for example pin diameter of 260 µm), and etched on a hotplate for 3 min at 100° C. On production of etch structures with a line width of about 1 mm on an n-doped (100) silicon wafer, the etching depth determined (depending on the printing and dispensing parameters) is 0.3-1 µm. The etching depth can be increased by increasing the KOH concentration and the line width. For line widths of 4 mm and KOH concentrations of 20-50% by weight, the etching depths are 2-3 µm.

The resultant etching paste is stable on storage, easy to handle and printable. It can be removed from the printed surface or layer or from the paste carrier (screen, doctor blade, template, stamp, klischee, cartridge, etc.) using a solvent, for example using water.

Example 2

8.0 g of KOH
26.4 g of deionised water
4.0 g of N-methylpyrrolidone
2.3 g of the Na salt of carboxymethylcellulose (Finnfix®)

The batch and processing were carried out as described in Example 1.

The etching paste was applied to the silicon surface using a dispenser (pin diameter 450 µm) and etched for 3 min at an etching temperature of 130° C. On production of etch structures with a line width of about 1 mm on an n-doped (100) silicon wafer, the etching depth determined (depending on the printing and dispensing parameters) is 0.2-1 µm.

Example 3

37.8% by weight of water
0.8% by weight of ethanolamine
50.0% by weight of ethylene glycol
4.7% by weight of tetraethylammonium hydroxide
4.7% by weight of tetrapropylammonium hydroxide
0.3% by weight of gallic acid
<0.1% by weight of pyrazine
1.8% by weight of the Na salt of carboxymethylcellulose (Finnfix®)

The batch and processing were carried out as described in Example 1.

The etching paste was applied to the silicon surface by screen printing or using a dispenser (pin diameter 450 µm) and etched for 3 min at an etching temperature of 130° C. The etching depth determined on production of etch structures with a line width of 1 mm is about 200 nm on a silicon wafer.

Example 4

39.4% by weight of deionised water
49.3% by weight of ethylene glycol
4.9% by weight of tetraethylammonium hydroxide
4.9% by weight of tetrapropylammonium hydroxide
1.5% by weight of the Na salt of carboxymethylcellulose (Finnfix®)

The batch and processing were carried out as described in Example 1.

The etching paste was applied to the silicon surface by screen printing or using a dispenser (pin diameter 450 µm) and etched for 3 min at an etching temperature of 130° C. The etching depth determined on production of etch structures with a line width of 1 mm is about 300 nm on a silicon wafer.

Example 5

50% by volume of tetraethylammonium hydroxide
20% by volume of ethylenediamine
20% by volume of deionised water
10% by volume of triethylenetetraamine
0.25 g of gallic acid
<0.1% by weight of pyrazine
3% by weight of xanthan gum The batch and processing were carried out as described in Example 1.

The etching paste was applied to the silicon surface by screen printing or using a dispenser (pin diameter 450 µm) and etched for 3 min at an etching temperature of 100° C. The etching depth determined on production of etch structures with a line width of 4 mm is about 1 µm on a silicon wafer.

[1] W. Wettling, Phys. Bl. 12 (1997), pp. 1197-1202
[2] J. Horzel, J. Slufzik, J. Nijs, R. Mertens, Proc. 26th IEEE PVSC, (1997), pp. 139-42
[3] M. Schnell, R. Lüdemann, S. Schäfer, Proc. $16^{th}$EU PVSEC, (2000), pp. 1482-85

[4] D. S. Ruby, P. Yang, S. Zaidi, S. Brueck, M. Roy, S. Narayanan, Proc. $2^{nd}$ World Conference and Exhibition on PVSEC, (1998), pp. 1460-63

[5] U.S. Pat. No. 6,091,021 (2000), D. S. Ruby, W. K. Schubert, J. M. Gee, S. H. Zaidi

[6] U.S. Pat. No. 5,871,591 (1999), D. S. Ruby, J. M. Gee, W. K. Schubert

[7] EP 0229915 (1986), M. Bock, K. Heymann, H.-J. Middeke, D. Tenbrink

[8] WO 00/40518 (1998), M. Luly, R. Singh, C. Redmon, J. Mckown, R. Pratt

[9] DE 10101926 (2000), S. Klein, L. Heider, C. Zielinski, A. Kübelbeck, W. Stockum

[10] A. F. Bogenschütz, Ätzpraxis für Halbleiter [Etching Practice for Semiconductors], Carl Hanser Verlag, Munich 1967

The invention claimed is:

1. A process for the selective etching of patterns or lines on silicon surfaces and layers to a depth of 1-3 µm, said process comprising:
    applying a printable thickened, alkaline liquid etching medium (a) over the entire surface area of said surface or layer, or (b) in accordance with an etch structure mask specifically only to the areas of the surface where etching is desired, and
    removing said medium after an exposure time of from 30 s to 5 minutes,
    wherein said etching medium is effective at temperatures from 70 to 150° C. or can be activated by the input of energy, and
    wherein said etching medium comprises
    (a) 30-40% by weight of a potassium hydroxide etching component, based on the total amount of an etching medium,
    (b) from 55-75% by weight, based on the total amount of said etching medium, of a solvent which is a mixture of water and at least one other solvent that is diethylene glycol, dipropylene glycol, polyethylene glycols, 1,2-propanediol, 1,4-butanediol, 1,3-butanediol, glycerol, 1,5 pentanediol, 2-ethyl-1-hexanol, acetophenone, methyl-2-hexanone, 2-octanone, 4-hydroxy-4-methyl-2-pentanone, 1-methyl-2-pyrrolidone, ethylene glycol monobutyl ether, ethylene glycol monomethyl ether, triethylene glycol monomethyl ether, diethylene glycol monobutyl ether, dipropylene glycol monomethyl ether, or a carboxylic acid ester,
    (c) 1.0-10% by weight of a thickener which is hydroxyalkylguar, xanthan gum, and/or ethyl hydroxypropyl or hydroxyethylcellulose, sodium carboxymethylhydroxyethylcellulose, homopolymers or copolymers based on functionalised vinyl units of acrylic acid, acrylates or alkyl methacrylates ($C_{10}$-$C_{30}$), individually or in a mixture, and
    (d) optionally an additive that is a thixotropic agent, a flow-control agent, a deaerator or an adhesion promoter, and
    wherein said etching medium selectively etches patterns or lines on said silicon surface or layer to a depth of 1-3 µm.

2. A process according to claim 1, wherein said thickener is sodium carboxymethylhydroxyethylcellulose, homopolymers or copolymers based on functionalised vinyl units of acrylic acid, acrylates or alkyl methacrylates ($C_{10}$-$C_{30}$), individually or in a mixture.

3. A process according to claim 2, wherein said thickener is from 1.5-6% by weight, based on the total amount of the etching medium.

4. A process according to claim 1, wherein said additive is a thixotropic agent, a flow-control agent, a deaerator or an adhesion promoter in an amount of from 0 to 2% by weight, based on the total amount.

5. A process according to claim 1, wherein said etching medium is activated by exposure to heat.

6. A process according to claim 5, wherein said source of heat is and IR lamp or a hotplate.

7. A process according to claim 1, wherein said etching medium is applied to the surface to be etched by template, pad, stamp, ink-jet or manual printing process or by a dispensing technique.

8. A process according to claim 1, wherein said etching medium is rinsed off using a solvent or solvent mixture when the etching is complete.

9. A method for etching of silicon surfaces and layers in a process for the production of semiconductor components and circuits thereof comprising applying an etching medium according to claim 1 to the surface of said silicon or layer in a process for the production of a semiconductor component and circuit thereof.

10. A method for etching of silicon surfaces and layers in a process for the production of components in high-performance electronics comprising applying an etching medium according to claim 1 to the surface of said silicon or a layer in a process for the production of a component in high-performance electronics.

11. A process according to claim 1, wherein said carboxylic acid ester is [2,2-butoxy(ethoxy)]ethyl acetate or propylene carbonate.

12. A process according to claim 1, wherein said additive is an antifoaming agent, a flow-control agent, a deaerator or an adhesion promoter.

13. A process according to claim 1, wherein said etching medium comprises
    a. 55-75% by weight of at least one solvent
    b. from 1.5-6% by weight of a thickener and optionally
    c. additives
and wherein said medium forms a paste that is activated by the input of energy, and said etching paste is printable.

14. A method for the selective etching of patterns or lines on silicon surfaces and layers for isolation of the pn transition in solar cells comprising:
    applying a printable thickened, alkaline liquid etching medium to the surface of said silicon or a layer for isolation of the pn transition in a solar cell,
    wherein said etching medium comprises
    (a) 30-40% by weight of a potassium hydroxide etching component, based on the total amount of an etching medium, and
    (b) from 55-75% by weight, based on the total amount of said etching medium, of a solvent which is a mixture of water and at least one other solvent that is diethylene glycol, dipropylene glycol, polyethylene glycols, 1,2-propanediol, 1,4-butanediol, 1,3-butanediol, glycerol, 1,5 pentanediol, 2-ethyl-1-hexanol, acetophenone, methyl- 2-hexanone, 2-octanone, 4-hydroxy-4-methyl-2-pentanone, 1-methyl-2-pyrrolidone, ethylene glycol monobutyl ether, ethylene glycol monomethyl ether, triethylene glycol monomethyl ether, diethylene glycol monobutyl ether, dipropylene glycol monomethyl ether, or a carboxylic acid ester, and
    (c) 1.0-10% by weight of a thickener which is hydroxyalkylguar, xanthan gum, and/or ethyl hydroxypropyl or hydroxyethylcellulose, sodium carboxymethylhydroxyethylcellulose, homopolymers or copolymers based on functionalised vinyl units of acrylic acid, acrylates or alkyl methacrylates ($C_{10}$-$C_{30}$), individually or in a mixture, and wherein said etching medium selectively etches patterns or lines on said silicon surface or layer for isolation of the pn transition in of a solar cell to a depth of 1-3 μm.

15. A process for the selective etching of patterns and lines on silicon surfaces and layers to a depth of 1-3 μm, comprising:

applying a printable thickened, alkaline liquid etching medium over the entire surface area of said surface or layer or in accordance with an etch structure mask specifically only to the areas of the surface where etching is desired, activating said medium by exposing to temperatures of from 70 to 150° C, and removing said medium after an exposure time of from 30 s to 5 minutes, wherein said etching medium comprises (a) 30-40% by weight of a potassium hydroxide etching component, based on the total amount of an etching medium, (b) from 55-75% by weight, based on the total amount of said etching medium, of a solvent which is a mixture of water and at least one other solvent that is diethylene glycol, dipropylene glycol, polyethylene glycols, 1,2-propanediol, 1,4-butanediol, 1,3-butanediol, glycerol, 1,5 pentanediol, 2-ethyl-1-hexanol, acetophenone, methyl-2-hexanone, 2-octanone, 4-hydroxy-4-methyl-2-pentanone, 1-methyl-2-pyrrolidone, ethylene glycol monobutyl ether, ethylene glycol monomethyl ether, triethylene glycol monomethyl ether, diethylene glycol monobutyl ether, dipropylene glycol monomethyl ether, or a carboxylic acid ester, and c) from 1.5-6% by weight of a thickener which is hydroxyalkylguar, xanthan gum, and/or ethyl hydroxypropyl or hydroxyethylcellulose, sodium carboxymethylhydroxyethylcellulose, homopolymers or copolymers based on functionalised vinyl units of acrylic acid, acrylates or alkyl methacrylates ($C_{10}$-$C_{30}$), individually or in a mixture, and wherein said etching medium selectively etches patterns and lines on said silicon surface or layer to a depth of 1-3 μm.

16. A process according to claim 15 wherein said etching medium comprises a) from 30 to 40% by weight of a potassium hydroxide etching component, based on the total amount of said etching medium b) from 55-75% by weight of a solvent mixture c) from 1.5 to 6% by weight of a thickener that is a sodium carboxymethylhydroxyethylcellulose and/or a crosslinked acrylic acid homopolymer.

* * * * *

UNITED STATES PATENT AND TRADEMARK OFFICE
CERTIFICATE OF CORRECTION

| | | |
|---|---|---|
| PATENT NO. | : 8,540,891 B2 | Page 1 of 1 |
| APPLICATION NO. | : 10/526497 | |
| DATED | : September 24, 2013 | |
| INVENTOR(S) | : Armin Kübelbeck | |

It is certified that error appears in the above-identified patent and that said Letters Patent is hereby corrected as shown below:

IN THE CLAIMS:

Column 10, lines 22-27 (claim 10) reads as follows:

-- A method for etching of silicon surfaces and layers in a process for the production of components in high-performance electronics comprising applying an etching medium according to claim 1 to the surface of said silicon or a layer in a process for the production of a component in high-performance electronics. --.

It should read:

-- A process according to claim 1 wherein the etching of silicon surfaces and layers occurs in a process for the production of components in high-performance electronics. --.

Signed and Sealed this
Twenty-second Day of April, 2014

Michelle K. Lee
*Deputy Director of the United States Patent and Trademark Office*